(12) United States Patent
Lower et al.

(10) Patent No.: US 8,617,913 B2
(45) Date of Patent: Dec. 31, 2013

(54) ALKALI SILICATE GLASS BASED COATING AND METHOD FOR APPLYING

(75) Inventors: Nathan P. Lower, North Liberty, IA (US); Alan P. Boone, Swisher, IA (US); Ross K. Wilcoxon, Cedar Rapids, IA (US); David D. Hillman, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 532 days.

(21) Appl. No.: 12/240,775

(22) Filed: Sep. 29, 2008

(65) Prior Publication Data

US 2009/0068474 A1    Mar. 12, 2009

Related U.S. Application Data

(63) Continuation-in-part of application No. 11/508,782, filed on Aug. 23, 2006, now Pat. No. 8,076,185, and a continuation-in-part of application No. 11/732,981, filed on Apr. 5, 2007, now Pat. No. 8,166,645, and a continuation-in-part of application No. 11/732,982, filed on Apr. 5, 2007, and a continuation-in-part of application No. 11/784,158, filed on Apr. 5, 2007, now Pat. No. 7,915,527, and a continuation-in-part of application No. 11/784,932, filed on Apr. 10, 2007, now Pat. No. 8,084,855, and a continuation-in-part of application No. 11/959,225, filed on Dec. 18, 2007, and a continuation-in-part of application No. 12/116,126, filed on May 6, 2008, now Pat. No. 8,174,830, and a continuation-in-part of application No. PCT/US2008/074224, filed on Aug. 25, 2008, and a continuation-in-part of application No. PCT/US2008/075591, filed on Sep. 8, 2008.

(51) Int. Cl.
  *H01L 21/00*    (2006.01)

(52) U.S. Cl.
  USPC ............................. 438/57; 438/72; 438/127

(58) Field of Classification Search
  USPC .............................. 438/57, 73, 106, 127, 778
  See application file for complete search history.

(56) References Cited

U.S. PATENT DOCUMENTS

| 3,508,974 A | 4/1970 | Bressler |
| 3,654,528 A | 4/1972 | Barkan |

(Continued)

FOREIGN PATENT DOCUMENTS

| JP | 55-120083 | 9/1980 |
| JP | 60-013875 | 1/1985 |

(Continued)

OTHER PUBLICATIONS

U.S. Appl. No. 12/286,207, filed Sep. 29, 2008, Lower et al.

(Continued)

*Primary Examiner* — Savitr Mulpuri
(74) *Attorney, Agent, or Firm* — Donna P. Suchy; Daniel M. Barbieri

(57) ABSTRACT

A coating for reducing interaction between a surface and the environment around the surface includes an alkali silicate glass material configured to protect the surface from environmental corrosion due to water or moisture. The alkali silicate glass material is doped with a first element to affect various forms of radiation passing through the coating. The electromagnetic radiation is at least one of ultraviolet, x-ray, atomic (gamma, alpha, beta), and electromagnetic or radio wave radiation. The coating may also be used to protect a solar cell from the environment and UV rays while retransmitting received light as usable light for conversion into electrical energy. The coating may also be used to prevent whisker formation in metal finishes of tin, cadmium, zinc, etc.

10 Claims, 7 Drawing Sheets

(56) References Cited

U.S. PATENT DOCUMENTS

| | | | |
|---|---|---|---|
| 3,723,790 A | 3/1973 | Dumbaugh et al. | |
| 3,812,404 A | 5/1974 | Barkan et al. | |
| 4,177,015 A | 12/1979 | Davidson | |
| 4,294,658 A | 10/1981 | Humphreys et al. | |
| 4,410,874 A | 10/1983 | Scapple et al. | |
| 4,505,644 A | 3/1985 | Meisner et al. | |
| 4,513,029 A | 4/1985 | Sakai | |
| 4,560,084 A | 12/1985 | Wolfson | |
| 4,572,924 A | 2/1986 | Wakely et al. | |
| 4,622,433 A | 11/1986 | Frampton | |
| 4,761,518 A | 8/1988 | Butt et al. | |
| 4,765,948 A | 8/1988 | DeLuca et al. | |
| 4,773,826 A | 9/1988 | Mole | |
| 4,802,531 A | 2/1989 | Nathenson et al. | |
| 4,882,212 A | 11/1989 | SinghDeo et al. | |
| 4,963,503 A | 10/1990 | Aoki et al. | |
| 5,041,342 A | 8/1991 | Umeda et al. | |
| 5,136,365 A | 8/1992 | Pennisi et al. | |
| 5,140,109 A | 8/1992 | Matsumoto et al. | |
| 5,184,211 A | 2/1993 | Fox | |
| 5,195,231 A | 3/1993 | Fanning et al. | |
| 5,232,970 A | 8/1993 | Solc et al. | |
| 5,244,726 A | 9/1993 | Laney et al. | |
| 5,265,136 A | 11/1993 | Yamazaki et al. | |
| 5,288,769 A | 2/1994 | Papageorge et al. | |
| 5,315,155 A | 5/1994 | O'Donnelly et al. | |
| 5,405,808 A | 4/1995 | Rostoker et al. | |
| 5,502,889 A | 4/1996 | Casson et al. | |
| 5,581,286 A | 12/1996 | Hayes et al. | |
| 5,686,703 A | 11/1997 | Yamaguchi | |
| 5,690,837 A | 11/1997 | Nakaso et al. | |
| 5,702,963 A | 12/1997 | Vu et al. | |
| 5,863,605 A | 1/1999 | Bak-Boychuk et al. | |
| 5,916,944 A | 6/1999 | Camilletti et al. | |
| 5,958,794 A | 9/1999 | Bruxvoort et al. | |
| 5,965,947 A | 10/1999 | Nam et al. | |
| 5,991,351 A | 11/1999 | Woolley | |
| 6,010,956 A | 1/2000 | Takiguchi et al. | |
| 6,019,165 A | 2/2000 | Batchelder | |
| 6,021,844 A | 2/2000 | Batchelder | |
| 6,027,791 A * | 2/2000 | Higashi et al. | 428/209 |
| 6,028,619 A | 2/2000 | Saita et al. | |
| 6,039,896 A | 3/2000 | Miyamoto et al. | |
| 6,048,656 A | 4/2000 | Akram et al. | |
| 6,087,018 A | 7/2000 | Uchiyama | |
| 6,110,656 A | 8/2000 | Eichorst et al. | |
| 6,121,175 A | 9/2000 | Drescher et al. | |
| 6,124,224 A | 9/2000 | Sridharan et al. | |
| 6,159,910 A | 12/2000 | Shimizu et al. | |
| 6,356,334 B1 | 3/2002 | Mathew et al. | |
| 6,370,015 B2 * | 4/2002 | Noda et al. | 361/321.2 |
| 6,423,415 B1 | 7/2002 | Greene et al. | |
| 6,451,283 B1 | 9/2002 | Kuznicki et al. | |
| 6,452,090 B2 | 9/2002 | Takato et al. | |
| 6,486,087 B1 | 11/2002 | Saling et al. | |
| 6,496,359 B2 | 12/2002 | Clark et al. | |
| 6,541,083 B1 | 4/2003 | Landa et al. | |
| 6,541,832 B2 | 4/2003 | Coyle | |
| 6,586,087 B2 | 7/2003 | Young | |
| 6,599,643 B2 | 7/2003 | Heimann et al. | |
| 6,617,041 B2 | 9/2003 | Hahn et al. | |
| 6,624,276 B2 | 9/2003 | Lamers et al. | |
| 6,658,861 B1 | 12/2003 | Ghoshal et al. | |
| 6,663,793 B2 | 12/2003 | Parkhill et al. | |
| 6,664,567 B2 | 12/2003 | Kyoda et al. | |
| 6,665,186 B1 | 12/2003 | Calmidi et al. | |
| 6,708,501 B1 | 3/2004 | Ghoshal et al. | |
| 6,798,072 B2 | 9/2004 | Kajiwara et al. | |
| 6,800,326 B1 | 10/2004 | Uchiyama | |
| 6,800,330 B2 | 10/2004 | Hayashi et al. | |
| 6,918,984 B2 | 7/2005 | Murray et al. | |
| 6,960,878 B2 | 11/2005 | Sakano et al. | |
| 6,986,859 B2 | 1/2006 | Mazany et al. | |
| 7,045,905 B2 | 5/2006 | Nakashima | |
| 7,078,263 B2 | 7/2006 | Dean | |
| 7,114,251 B2 | 10/2006 | Mashino | |
| 7,131,286 B2 | 11/2006 | Ghoshal et al. | |
| 7,175,937 B2 | 2/2007 | Cho et al. | |
| 7,176,564 B2 | 2/2007 | Kim | |
| 7,202,598 B2 | 4/2007 | Juestel et al. | |
| 7,265,977 B2 | 9/2007 | Martin et al. | |
| 7,293,416 B2 | 11/2007 | Ghoshal | |
| 7,296,417 B2 | 11/2007 | Ghoshal | |
| 7,297,206 B2 | 11/2007 | Naruse et al. | |
| 7,307,286 B2 | 12/2007 | Ito et al. | |
| 7,327,039 B2 | 2/2008 | Charles et al. | |
| 7,340,904 B2 | 3/2008 | Sauciuc et al. | |
| 7,342,787 B1 | 3/2008 | Bhatia | |
| 7,348,665 B2 | 3/2008 | Sauciuc et al. | |
| 7,365,984 B2 | 4/2008 | Jeong | |
| 7,391,060 B2 * | 6/2008 | Oshio | 257/98 |
| 7,441,087 B2 | 10/2008 | Hakura et al. | |
| 7,473,460 B2 | 1/2009 | Meguro et al. | |
| 7,491,431 B2 * | 2/2009 | Chiruvolu et al. | 427/582 |
| 7,497,961 B2 | 3/2009 | Keenan et al. | |
| 7,651,556 B2 | 1/2010 | Komiyama et al. | |
| 7,671,468 B2 | 3/2010 | Kanazawa et al. | |
| 7,692,259 B2 * | 4/2010 | Suehiro | 257/431 |
| 7,709,093 B2 | 5/2010 | Makowski et al. | |
| 7,737,356 B2 * | 6/2010 | Goldstein | 136/251 |
| 7,910,403 B2 | 3/2011 | Hirano et al. | |
| 7,985,392 B2 | 7/2011 | Hayashi et al. | |
| 8,076,185 B1 | 12/2011 | Lower et al. | |
| 8,084,855 B2 | 12/2011 | Lower et al. | |
| 2001/0015443 A1 * | 8/2001 | Komoto | 257/81 |
| 2001/0030493 A1 | 10/2001 | Noda et al. | |
| 2001/0046933 A1 | 11/2001 | Parkhill et al. | |
| 2002/0000630 A1 | 1/2002 | Coyle | |
| 2002/0054976 A1 | 5/2002 | Nakamura et al. | |
| 2002/0076192 A1 * | 6/2002 | Bartholomew et al. | 385/142 |
| 2002/0078856 A1 | 6/2002 | Hahn et al. | |
| 2002/0086115 A1 | 7/2002 | Lamers et al. | |
| 2002/0170173 A1 | 11/2002 | Mashino | |
| 2002/0189495 A1 | 12/2002 | Hayashi et al. | |
| 2002/0189894 A1 | 12/2002 | Davis et al. | |
| 2003/0047735 A1 | 3/2003 | Kyoda et al. | |
| 2003/0080341 A1 | 5/2003 | Sakano et al. | |
| 2003/0218258 A1 | 11/2003 | Charles et al. | |
| 2003/0228424 A1 | 12/2003 | Dove et al. | |
| 2004/0106037 A1 | 6/2004 | Cho et al. | |
| 2004/0116577 A1 | 6/2004 | Naruse et al. | |
| 2004/0156995 A1 | 8/2004 | Komiyama et al. | |
| 2004/0194667 A1 | 10/2004 | Reuscher | |
| 2005/0003947 A1 | 1/2005 | Mazany et al. | |
| 2005/0082691 A1 | 4/2005 | Ito et al. | |
| 2005/0099775 A1 | 5/2005 | Pokharna et al. | |
| 2005/0116237 A1 | 6/2005 | Voutsas | |
| 2005/0123684 A1 | 6/2005 | Makowski et al. | |
| 2005/0179742 A1 | 8/2005 | Keenan et al. | |
| 2006/0045755 A1 | 3/2006 | McDonald et al. | |
| 2006/0068218 A1 * | 3/2006 | Hooghan et al. | 428/615 |
| 2006/0095677 A1 | 5/2006 | Hakura et al. | |
| 2006/0113066 A1 | 6/2006 | Mongia et al. | |
| 2006/0135342 A1 | 6/2006 | Anderson et al. | |
| 2006/0158849 A1 | 7/2006 | Martin et al. | |
| 2006/0250731 A1 | 11/2006 | Parkhurst et al. | |
| 2006/0268525 A1 | 11/2006 | Jeong | |
| 2006/0283546 A1 | 12/2006 | Tremel et al. | |
| 2007/0075323 A1 * | 4/2007 | Kanazawa et al. | 257/98 |
| 2007/0102833 A1 | 5/2007 | Hack et al. | |
| 2007/0108586 A1 | 5/2007 | Uematsu et al. | |
| 2007/0224400 A1 * | 9/2007 | Meguro et al. | 428/209 |
| 2008/0006204 A1 * | 1/2008 | Rusinko et al. | 118/715 |
| 2008/0050512 A1 | 2/2008 | Lower et al. | |
| 2008/0063875 A1 | 3/2008 | Robinson et al. | |
| 2008/0142966 A1 | 6/2008 | Hirano et al. | |
| 2008/0299300 A1 | 12/2008 | Wilcoxon et al. | |
| 2009/0110904 A1 * | 4/2009 | Mack et al. | 428/304.4 |
| 2009/0183774 A1 * | 7/2009 | Atanackovic | 136/261 |
| 2009/0279257 A1 | 11/2009 | Lower et al. | |
| 2010/0064518 A1 | 3/2010 | Lower et al. | |
| 2010/0064695 A1 | 3/2010 | Wilcoxon et al. | |

(56) References Cited

U.S. PATENT DOCUMENTS

| | | | |
|---|---|---|---|
| 2010/0065256 | A1 | 3/2010 | Wilcoxon et al. |
| 2010/0066178 | A1 | 3/2010 | Lower et al. |
| 2012/0118623 | A1 | 5/2012 | Lower et al. |

FOREIGN PATENT DOCUMENTS

| | | |
|---|---|---|
| JP | 57-027942 | 2/1985 |
| JP | 02-064071 | 3/1990 |
| JP | 11-095246 | 4/1994 |
| JP | 2003-332505 A | 11/2003 |
| JP | 2006-045420 | 2/2006 |
| WO | WO-2006/095677 | 9/2006 |
| WO | WO 2006/095677 A1 | 9/2006 |

OTHER PUBLICATIONS

U.S. Appl. No. 12/116,126, filed May 6, 2008, Lower et al.
U.S. Appl. No. 11/959,225, filed Dec. 18, 2007, Lower et al.
U.S. Appl. No. 11/784,932, filed Apr. 10, 2007, Lower et al.
U.S. Appl. No. 11/732,981, filed Apr. 5, 2007, Wilcoxon et al.
U.S. Appl. No. 11/732,982, filed Apr. 5, 2007, Boone et al.
U.S. Appl. No. 11/784,158, filed Apr. 5, 2007, Lower et al.
U.S. Appl. No. 11/508,782, filed Aug. 23, 2006, Lower et al.
PCT/US2008/074224, Aug. 25, 2008, Rockwell Collins, Inc.
PCT/US2008/075591, Aug. 25, 2008, Rockwell Collins, Inc.
PCT/US2009/031699, Jan. 22, 2008, Rockwell Collins, Inc.
Click, et al., "Schott Low Temperature Bonding for Precision Optics," can be found at website: http://optics.nasa.gov/tech_days/tech_days_2004/docs/18%20Aug%202004/23%20Schott%20Low%20Temperature%20Bonding.pdf, p. 20.
Lewis, J. A., et al., Materialstoday: Jul./Aug. 2004, Direct Writing in three dimension, ISSN: 1369 7021 © Elsevier Ltd 2004, pp. 32-39.
Optomec® Systems M3D® Breakthrough Technology for Printable Electronics, pp. 1-2.
PQ Corporation, "Bonding and Coating Applications of PQ® Soluble Silicates," Bulletin 12-31, (2003) p. 7.
PQ Corporation, PQ® Soluble Silicates in Refractory and Chemical-Resistant Cements, Bulletin 24-1, (2003), p. 6.
Thresh, John C., "The Action of Natural Waters on Lead," The Analyst, vol. XLVII, No. 560, (Nov. 1922) pp. 459-468.
Golubev, K.S., et al., Modeling of Acid-Base Properties of Binary Alkali-Silicate Melts, Rev. Adv. Mater. Sci. 6, (2004), pp. 33-40, website: http://www.ipme.ru/e-journals/RAMS/no_1604/golubev/golubev.pdf.
International Search Report and Written Opinion for International Application No. PCT/US2008/074224, mail date Jan. 30, 2009, 10 pages.
International Search Report and Written Opinion for International Application No. PCT/US2008/075591, mail date Apr. 8, 2009, 7 pages.
Kennedy, C. R., Strength and Fracture Toughness of Binary Alkali Silicate Glasses (Abstract only), Feb. 14, 1974, website: http://oai.dtic.mil/oai/oai?verb=getRecord&metadataPrefix=html&identifier=ADA016820, 1 page.
Mysen, B. et al. Silicate Glasses and Melts, vol. 10: Properties and Structure (Developments in Geochemistry) (Book Description), website: http://www.amazon.com/Silicate-Glasses-Melts-Developments-Geochemistry/dp/0444520112, 4 pgs.
Nascimento, M. L. F., et al. Universal curve of ionic conductivities in binary alkali silicate glasses, Journal of Materials Science (2005), Springer Science + Business Media, Inc., website: http://www.springerlink.com/content/p7535075x1872016/, 3 pgs.
Notice of Allowance for U.S. Appl. No. 11/784,158, mail date Nov. 29, 2010, 8 pages.
Office Action for U.S. Appl. No. 11/508,782, mail date Sep. 2, 2010, 14 pages.
Office Action for U.S. Appl. No. 12/284,670, mail date Sep. 28, 2010, 11 pages.
Office Action for U.S. Appl. No. 11/732,981, mail date Oct. 6, 2010, 10 pages.
Office Action for U.S. Appl. No. 12/116,126, mail date Oct. 25, 2010, 9 pages.
Office Action for U.S. Appl. No. 11/959,225, mail date Oct. 27, 2010, 12 pages.
Office Action for U.S. Appl. No. 11/784,932, mail date Nov. 10, 2010, 10 pages.
Pedone, A., et al. Insight into Elastic Properties of Binary Alkali Silicate Glasses; Prediction and Interpretation through Atomistic Simulation Techniques, Chemistry of Materials, 2007, vol. 19, No. 13, pp. 3144-3154, American Chemical Society (Abstract only) website: http://pubs.acs.org/doi/abs/10.1021/cm062619r, 2 pgs.
Shermer, H. F., Thermal expansion of binary alkali silicate glasses, Journal of Research of the National Bureau of Standards, vol. 57, No. 2, Aug. 1956, Research Paper No. 2698, website: http://nvl.nist.gov/pub/nistpubs/jres/057/2/V57.N02.A05.pdf, 5 pgs.
The Mixed—Alkali Effect for the Viscosity of Glasses, printed on Dec. 3, 2010 from website: http://glassproperties.com/viscosity/mixed-alkali-effect-viscosity/, 7 pages.
The Structure of Glasses. Alkali silicate glasses, printed on Dec. 3, 2010 from website: http://www.ptc.tugraz.at/specmag/struct/ss.htm, 1 page.
International Search Report and Written Opinion for International Application No. PCT/US2008/074224, mail date Jan. 30, 2009, 9 pages.
Office Action for U.S. Appl. No. 12/286,207, mail date Dec. 27, 2010, 15 pages.
Office Action for U.S. Appl. No. 11/508,782, mail date Jan. 19, 2011, 10 pages.
Office Action for U.S. Appl. No. 11/732,982, mail date Feb. 2, 2011, 16 pages.
Office Action for U.S. Appl. No. 12/284,670, mail date Feb. 17, 2011, 13 pages.
Office Action for U.S. Appl. No. 12/116,126, mail date Feb. 25, 2011, 9 pages.
Office Action for U.S. Appl. No. 11/732,981, mail date Mar. 16, 2011, 7 pages.
Office Action for U.S. Appl. No. 12/116,126, mail date Nov. 20, 2009, 7 pages.
Office Action for U.S. Appl. No. 11/784,932, mail date Feb. 16, 2010, 11 pages.
Office Action for U.S. Appl. No. 11/508,782, mail date Feb. 24, 2010, 12 pages.
Office Action for U.S. Appl. No. 11/784,158, mail date Oct. 8, 2009, 7 pages.
Office Action for U.S. Appl. No. 11/784,158, mail date Mar. 26, 2010, 7 pages.
Non-Final Office Action for Appl. No. 11/784,932, dated Apr. 3, 2009, 8 pages.
Non-Final Office Action for Appl. No. 11/784,158, dated Apr. 21, 2009, 10 pages.
Final Office Action for U.S. Appl. No. 11/508,782, dated Jun. 16, 2009, 13 pages.
Office Action for U.S. Appl. No. 12/116,126, mail date Apr. 22, 2010, 7 pages.
Office Action for U.S. Appl. No. 11/959,225, mail date May 26, 2010, 17 pages.
Office Action for U.S. Appl. No. 11/784,158, mail date Jun. 17, 2010, 7 pages.
U.S. Appl. No. 12/284,670, filed Sep. 24, 2008, Cripe et al.
U.S. Appl. No. 12/240,775, filed Sep. 29, 2008, Lower et al.
International Search Report and Written Opinion for Application No. PCT/US2009/036355, mail date Jun. 30, 2009, 11 pages.
International Search Report and Written Opinion for Application No. PCT/US2009/031699, mail date Aug. 18, 2009, 16 pages.
Office Action for U.S. Appl. No. 11/959,225, mail date Dec. 2, 2009, 15 pages.
Amendment and Reply for U.S. Appl. No. 11/508,782, mail date Sep. 2, 2008, 10 pages.
Amendment and Reply for U.S. Appl. No. 11/508,782, mail date Mar. 24, 2009, 10 pages.
Amendment and Reply for U.S. Appl. No. 11/508,782, mail date Aug. 14, 2009, 12 pages.

(56) References Cited

OTHER PUBLICATIONS

Advisory Action for U.S. Appl. No. 11/508,782, mail date Aug. 31, 2009, 3 pages.
Response for U.S. Appl. No. 11/508,782, mail date Nov. 13, 2009, 14 pagesd.
Amendment and Reply for U.S. Appl. No. 11/508,782, mail date Jun. 24, 2010, 10 pages.
Amendment and Reply for U.S. Appl. No. 11/508,782, mail date Nov. 2, 2010, 12 pages.
Supplemental Amendment and Reply for U.S. Appl. No. 11/508,782, mail date Nov. 3, 2010, 3 pages.
Advisory Action for U.S. Appl. No. 11/508,782, mail date Nov. 23, 2010, 5 pages.
Request for Continued Examination for U.S. Appl. No. 11,508,782, mail date Dec. 2, 2010, 10 pages.
Examiner Interview Summary for U.S. Appl. No. 11/508,782, mail date Jan. 5, 2011, 2 pages.
Amendment and Reply for U.S. Appl. No. 11/508,782, mail date Apr. 5, 2011, 9 pages.
Notice of Allowance for U.S. Appl. No. 11/508,782, mail date May 31, 2011, 9 pages.
Notice of Allowance for U.S. Appl. No. 11/508,782, mail date Jul. 26, 2011, 4 pages.
Request for Continued Examination for U.S. Appl. No. 11/508,782, mail date Aug. 30, 2011, 6 pages.
Notice of Allowance for U.S. Appl. No. 11/508,782, mail date Sep. 20, 2011, 7 pages.
Response for U.S. Appl. No. 11/784,158, mail date Jan. 8, 2010, 10 pages.
Terminal Disclaimer for U.S. Appl. No. 11/784,158, mail date May 26, 2010, 1 page.
Amendment and Reply for U.S. Appl. No. 11/784,158, mail date May 26, 2010, 12 pages.
Terminal Disclaimer Decision for U.S. Appl. No. 11/784,158, mail date Jun. 8, 2010, 1 page.
Office Action for U.S. Appl. No. 11/959,225, mail date Jul. 22, 2009, 10 pages.
Response for U.S. Appl. No. 11/959,225, mail date Mar. 2, 2010, 9 pages.
Amendment and Reply for U.S. Appl. No. 11/959,225, mail date Jan. 27, 2011, 9 pages.
Office Action for U.S. Appl. No. 11/959,225, mail date Apr. 13, 2011, 16 pages.
Amendment and Reply for U.S. Appl. No. 11/959,225, mail date Jun. 13, 2011, 12 pages.
Advisory Action for U.S. Appl. No. 11/959,225, mail date Jul. 5, 2011, 3 pages.
Response U.S. Appl. No. 12/116,126, mail date Feb. 22, 2010, 10 pages.
Office Action for U.S. Appl. No. 12/116,126, mail date May 10, 2011, 8 pages.
Amendment and Reply for U.S. Appl. No. 12/116,126, mail date Aug. 10, 2011, 11 pages.
Office Action for U.S. Appl. No. 12/116,126, mail date Sep. 12, 2011, 11 pages.
Terminal Disclaimer for U.S. Appl. No. 11/732,981, mail date May 16, 2011, 1 page.
Request for Continued Examination for U.S. Appl. No. 11/732,981, mail date May 16, 2011, 12 pages.
Terminal Disclaimer Decision for U.S. Appl. No. 11/732,981, mail date Jul. 11, 2011, 1 page.
Notice of Allowance for U.S. Appl. No. 11/732,981, mail date Jul. 26, 2011, 7 pages.
Response for U.S. Appl. No. 11/784,932, mail date Jul. 2, 2009, 8 pages.
Notice of Allowance for U.S. Appl. No. 11/784,932, mail date May 12, 2011, 11 pages.
Request for Continued Examination for U.S. Appl. No. 11/784,932, Aug. 10, 2011, 6 pages.
Notice of Allowance for U.S. Appl. No. 11/784,932, mail date Aug. 23, 2011, 8 pages.
Notice of Allowance for U.S. Appl. No. 12/284,670, mail date May 11, 2011, 7 pages.
Office Action for U.S. Appl. No. 11/732,982, mail date Jun. 21, 2011, 14 pages.
Request for Continued Examination for U.S. Appl. No. 11/732,982, mail date Aug. 22, 2011, 11 pages.
Office Action for U.S. Appl. No. 11/732,982, mail date Sep. 14, 2011, 13 pages.
Notice of Allowance for U.S. Appl. No. 12/286,207, mail date Jun. 27, 2011, 12 pages.
Notice of Allowance for U.S. Appl. No. 12/286,207, mail date Oct. 6, 2011, 8 pages.
Office Action for U.S. Appl. No. 11/508,782, mail date Dec. 24, 2008, 9 pages.
Office Action for U.S. Appl. No. 11/959,225, mail date Nov. 18, 2011, 17 pages.
Amendment and Reply for U.S. Appl. No. 12/116,126, mail date Dec. 12, 2011, 10 pages.
Notice of Allowance for U.S. Appl. No. 12/116,126, mail date Jan. 5, 2012, 10 pages.
Amendment and Reply for U.S. Appl. No. 12/240,775, mail date Sep. 26, 2011, 11 pages.
Request for Continued Examination for U.S. Appl. No. 11/732,981, mail date Oct. 25, 2011, 4 pages.
Notice of Allowance for U.S. Appl. No. 11/732,981, mail date Dec. 29, 2011, 7 pages.
Amendment and Reply for U.S. Appl. No. 11/732,982, mail date Jan. 13, 2012, 11 pages.
Office Action for U.S. Appl. No. 13/287,734, mail date Apr. 11, 2013, 18 pages.
Amendment and Reply for U.S. Appl. No. 11/959,225, mail date Jul. 22, 2013, 7 pages.
Amendment and Reply for U.S. Appl. No. 13/287,734, mail date Jul. 9, 2013, 10 pages.
Notice of Allowance for U.S. Appl. No. 11/732,982, mail date Jul. 10, 2013, 6 pages.
Notice of Allowance for U.S. Appl. No. 13/359,105, mail date Jun. 24, 2013, 9 pages.
Office Action for U.S. Appl. No. 13/329,068, mail date Jun. 7, 2013, 6 pages.
Notice of Allowance for U.S. Appl. No. 11/732,982, mail date Dec. 19, 2012, 2 pages.
Office Action for U.S. Appl. No. 11/959,225, mail date Apr. 25, 2012, 17 pages.
Office Action for U.S. Appl. No. 11/959,225, mail date Sep. 25, 2012, 16 pages.
Office Action for U.S. Appl. No. 13/359,105, mail date Jan. 17, 2013, 7 pages.
Restriction Requirement for U.S. Appl. No. 13/329,068, mail date Jan. 15, 2013, 5 pages.
Office Action for U.S. Appl. No. 11/959,225, mail date Apr. 23, 2013, 6 pages.
Amendment and Reply for U.S. Appl. No. 11/959,225, mail date Aug. 24, 2009, 2 pages.
Amendment and Reply for U.S. App. No. 11/959,225, mail date Aug. 26, 2010, 11 pages.
Amendment and Reply for U.S. Appl. No. 11/959,225, mail date Jul. 5, 2011, 6 pages.
Amendment and Reply for U.S. Appl. No. 11/959,225, mail date Feb. 15, 2012, 15 pages.
Amendment and Reply for U.S. Appl. No. 11/959,225, mail date Jun. 25, 2012, 14 pages.
Advisory Action for U.S. Appl. No. 11/959,225, mail date Jul. 31, 2012, 3 pages.
Request for Continued Examination for U.S. Appl. No. 11/959,225, mail date Aug. 27, 2012, 19 pages.
Amendment and Reply for U.S. Appl. No. 12/116,126, mail date Jun. 22, 2010, 7 pages.
Advisory Action for U.S. Appl. No. 12/116,126, mail date Jun. 29, 2010, 4 pages.

(56) References Cited

OTHER PUBLICATIONS

Request for Continued Examination for U.S. Appl. No. 12/116,126, mail date Jul. 22, 2010, 4 pages.
Amendment and Reply for U.S. Appl. No. 12/116,126, mail date Jul. 22, 2010, 9 pages.
Amendment and Reply for U.S. Appl. No. 12/116,126, mail date Jan. 25, 2011, 8 pages.
Request for Continued Examination for U.S. Appl. No. 12/116,126, mail date Apr. 29, 2011, 4 pages.
Amendment and Reply for U.S. Appl. No. 12/116,126, mail date Apr. 29, 2011, 9 pages.
Restriction Requirement for U.S. Appl. No. 11/732,982, mail date Sep. 24, 2010, 5 pages.
Amendment and Reply for U.S. Appl. No. 11/732,982, mail date Oct. 25, 2010, 6 pages.
Amendment and Reply for U.S. Appl. No. 11/732,982, mail date May 2, 2011, 12 pages.
Office Action for U.S. Appl. No. 11/732,982, mail date Apr. 16, 2012, 15 pages.
Amendment and Reply for U.S. Appl. No. 11/732,982, mail date Jun. 14, 2012, 11 pages.
Office Action for U.S. Appl. No. 11/732,982, mail date Jul. 3, 2012, 15 pages.
Amendment and Reply for U.S. Appl. No. 11/732,982, mail date Sep. 28, 2012, 7 pages.
Notice of Allowance for U.S. Appl. No. 11/732,982, mail date Nov. 8, 2012, 8 pages.
Request for Continued Examination for U.S. Appl. No. 11/784,932, mail date Jun. 14, 2010, 4 pages.
Amendment and Reply for U.S. Appl. No. 11/784,932, mail date Jun. 14, 2010, 9 pages.
Amendment and Reply for U.S. Appl. No. 12/284,670, mail date Apr. 18, 2011, 9 pages.
Restriction Requirement for U.S. Appl. No. 12/493,022, mail date Feb. 22, 2012, 6 pages.
Amendment and Reply for U.S. Appl. No. 12/493,022, mail date Mar. 23, 2012, 3 pages.
Office Action for U.S. Appl. No. 12/493,022, mail date May 30, 2012, 13 pages.
Amendment and Reply for U.S. Appl. No. 12/493,022, mail date Aug. 28, 2012, 7 pages.
Notice of Allowance for U.S. Appl. No. 12/493,022, mail date Sep. 20, 2012, 5 pages.
Office Action for U.S. Appl. No. 13/359,105, mail date May 8, 2012, 12 pages.
Amendment and Reply for U.S. Appl. No. 13/359,105, mail date Aug. 8, 2012, 10 pages.
Office Action for U.S. Appl. No. 13/359,105, mail date Oct. 19, 2012, 7 pages.
Amendment and Reply for U.S. Appl. No. 11/784,158, mail date Jul. 21, 2009, 10 pages.
Amendment and Reply for U.S. Appl. No. 11/732,981, mail date Jan. 6, 2011, 9 pages.
Amendment and Reply for U.S. Appl. No. 12/286,207, mail date Mar. 28, 2011, 12 pages.
Request for Continued Examination for U.S. Appl. No. 12/286,207, mail date Sep. 26, 2011, 4 pages.

* cited by examiner

ALKALI SILICATE GLASS BASED COATING AND METHOD FOR APPLYING

CROSS-REFERENCE OF RELATED APPLICATIONS

This application is a continuation-in-part and claims priority to U.S. patent application Ser. No. 11/508,782, filed Aug. 23, 2006, U.S. patent application Ser. No. 11/784,158, filed on Apr. 5, 2007, U.S. patent application Ser. No. 11/732,982, filed on Apr. 5, 2007, U.S. patent application Ser. No. 11/732,981, filed on Apr. 5, 2007, U.S. patent application Ser. No. 11/784,932, filed on Apr. 10, 2007, U.S. patent application Ser. No. 11/959,225, filed on Dec. 18, 2007, U.S. application Ser. No. 12/116,126, filed on May 6, 2008, PCT Application No. PCT/US2008/074224, filed on Aug. 25, 2008, and PCT Application No. PCT/US2008/075591, filed on Sep. 8, 2008, the entire disclosures of which are incorporated herein by reference.

BACKGROUND

Many conventional products, including but not limited to microelectronics components, often include a wide variety of coating materials. These coating materials are used in an attempt enhance performance of the product or increase product reliability. Coatings are often used to correct for a known deficiency within the product itself. For example, a thermal coating can be added to help dissipate heat from a specific area of a product to prevent it from overheating during use. In another example, a protective coating may be used to enhance the reliability or manufacturability (e.g., processing windows) of the product itself.

These coatings may be organic or inorganic materials. Conventional organic coatings absorb moisture, ultraviolet (UV) radiation, etc. Moisture can degrade the coatings and/or the material interfaces they connect through chemical decomposition, material expansion, etc. Other factors such as elevated temperature, ozone, ultraviolet light, etc. can also degrade organic coating materials. In addition, organic-based coatings conventionally have coefficients of thermal expansion on the order of 100 ppm/degrees Celsius, which can lead to adhesion and/or cohesion failures when products are subjected to temperature variations. These types of degradation of the coating or device can limit suitability for use in harsh environments and can lead to failures during the operational lifetime of the devices. Application of conventional inorganic coatings may require expensive and/or high-stress environments, such as chemical vapor deposition, or very high processing temperatures.

Further, circuits are conventionally mounted to circuit boards and other substrates using soldered joints. Due to concerns with disposal of lead-based solders, the solder may often be a lead-free solder. Lead-free assemblies often contain components that have a surface finish of electroplated tin, which may have a tendency to develop "whiskers" or filaments that grow out of tin. Such whiskers can cause electrical shorting if the filaments extend to other metal surfaces or can undesirably coat and adhere to adjacent surfaces. In addition to electronic substrates that use tin surface finishes, other metal surfaces often have metal coatings of materials such as tin, cadmium, or zinc that can also produce similar whisker filaments.

In various devices such as a magnetic resonance imaging devices or nuclear magnetic resonance devices, the device may be liquid cooled. The liquid coolant is typically high purity deionized water and must remain highly pure and non-conductive in order to prevent deterioration of the readings made by the device. Corrosion of the coolant system by the coolant liquid can lead to a decrease in the purity of the cooling liquid and subsequent increase in conductivity and degradation of device performance.

Therefore, a need exists for a material that can coat surfaces in a reliable manner and that is not susceptible to harsh environments. A need also exists for a material for coating a surface that is capable of providing protection from moisture as well as from breakdown by various forms of radiation (such as UV). A need also exists for a material or method for coating surfaces with finishes of materials such as tin, cadmium, zinc, etc. so they do not whisker. A need also exists for a material that will prevent the internal corrosion of liquid cooling systems and maintain a high level of cooling fluid purity and resistivity within it. A need also exists for a material that can be processed and cured at temperatures less than 200 degrees Celsius.

SUMMARY

One embodiment of the disclosure relates to an electronic assembly. The electronic assembly includes an electronic device mounted on a substrate by at least one solder joint or electrical interconnect and an alkali silicate glass based coating at least partially covering at least one joint or electrical interconnect surface that has a whisker prone finish.

Another embodiment of the disclosure relates to a method for preventing the oxidation of the surface of a solder joint or other electrical interconnect of an electronic device. The method includes applying an alkali silicate glass based coating to the surface of electrical interconnect.

Another embodiment of the disclosure relates to a coating for reducing interaction between a surface and the environment around the surface. The coating includes an alkali silicate glass material configured to protect the surface from environmental corrosion due to water or moisture. The alkali silicate glass material may or may not be doped with a first element to affect the radiation passing through the coating.

Another embodiment of the disclosure relates to a coating for reducing corrosion of a solar cell. The coating includes an alkali silicate glass material configured to protect the solar cell from environmental corrosion due to water or moisture. The coating may or may not be doped to protect the solar cell from UV radiation. The coating may or may not act as an anti-reflective material to improve light transmission into the solar cell.

Another embodiment of the disclosure relates to a method for improving moisture durability and corrosion protection in a liquid cooling pipe. The method includes providing a first liquid in the liquid cooling pipe to clean the liquid cooling pipe, providing an alkali silicate glass material such that at least a portion of an interior of the liquid cooling pipe is coated with the alkali silicate glass material, and curing the alkali silicate glass material. The alkali silicate glass functions to prevent direct contact between cooling pipe and high purity liquid coolant, and therefore prevents corrosion of the cooling pipes or the introduction of impurities to the liquid coolant.

BRIEF DESCRIPTION OF THE DRAWINGS

The disclosure will become more fully understood from the following detailed description, taken in conjunction with the accompanying drawings, wherein like reference numerals refer to like elements, in which.

DETAILED DESCRIPTION OF THE EXEMPLARY EMBODIMENTS

Figure 1:
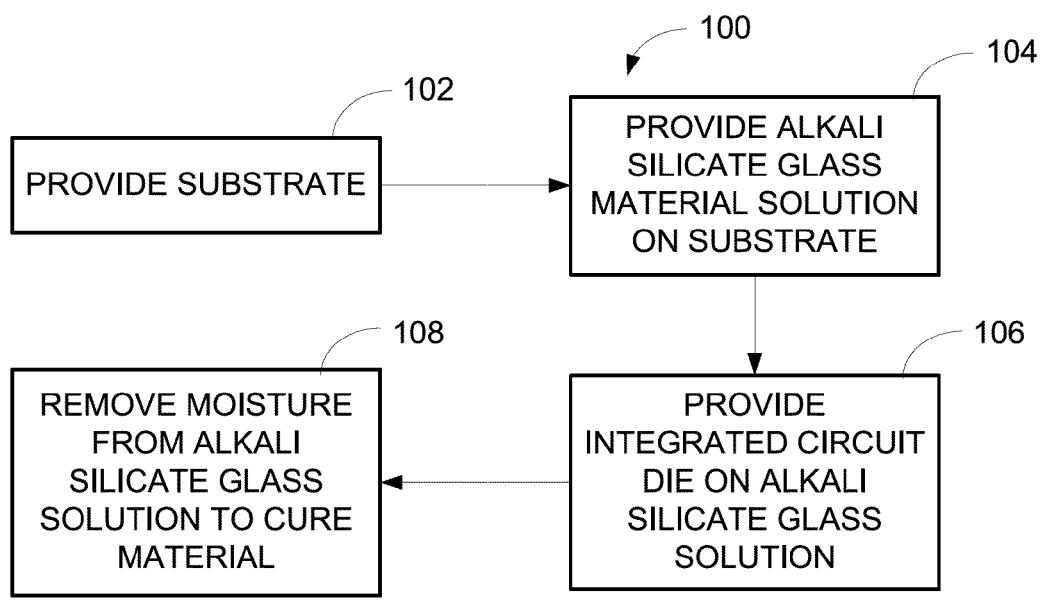
FIG. 1 is a flow diagram illustrating the steps in a method for producing an integrated circuit assembly according to an exemplary embodiment.

According to an exemplary embodiment, an alkali silicate glass material is used as a material for coupling or joining one or more electronic components together (e.g., in place of more conventional adhesive materials such as an epoxy-based die attach material), for coating the one or more electronic components, or for coating another surface. The alkali silicate glass material is provided in the form of a liquid solution that is provided between the surfaces of two components to be joined together. The solution is then cured to remove the water therefrom, which leaves a solid, moisture-impermeable material that adheres the two surfaces together.

The alkali silicate glass material advantageously exhibits dielectric material properties that are similar to or better than current adhesive materials. In contrast to more traditional adhesive materials, however, the alkali silicate glass materials are relatively resistant to moisture (i.e., the material generally will not absorb moisture), which makes such materials suitable for use in environments in which humidity absorption can degrade the mechanical properties of the substrate and/or modify its electrical characteristics.

According to an exemplary embodiment, an alkali silicate material is provided in solution with a liquid such as deionized water, after which the water is removed from the solution such that the remaining alkali silicate glass material may act to couple or join two or more electronic components together. The solution may include one or more alkali silicates, such as lithium, sodium, potassium, rubidium, cesium, or francium silicate materials. The solution may include a single type of alkali silicate (e.g., lithium silicate) or more than one type (e.g., a 1:1 molar ratio of lithium silicate and potassium silicate or a 1:1 molar ratio of lithium silicate and sodium silicate).

Liquid alkali silicate solutions are commercially available from companies such as PQ Corporation of Malvern, Pa. in a wide variety of $SiO_2$ to $M_2O$ weight ratios (this ratio may be referred to as the "R value" for the solution). For example, solutions having R values of between 1.00 and 3.5 or greater than 3.5 may be obtained or created by dissolving additional silica into aqueous alkali silicate solutions. These solutions may be used as-is or may be further modified (e.g., by adding deionized water to the solution, by adding particles to modify its thermal expansion coefficient or other characteristics, etc.). The particular materials utilized may vary depending on the desired application, material properties, and other factors according to various exemplary embodiments.

Highly siliceous liquid alkali silicate solutions tend to air dry rapidly, are the most refractory (high melting temperature), and are the most resistant to acids and corrosion. These silica rich liquid solutions tend to contain more water than alkaline rich solutions (per similar viscosity), and thus undergo greater shrinkage while curing. Low silicate ratio, alkaline rich, solutions tend to have greater elasticity, lower brittleness, and less shrinkage but may exhibit poor corrosion resistance. These low ratio coatings also dry more slowly because their alkali content creates a greater affinity for water. Many chemically resistant cements and mortars are produced using high ratio (e.g., approximately 3.25) alkali silicate solutions. Alternatively, high alkali ratio silicate solutions may be doped with filler materials to produce a composite that has excellent moisture and corrosion resistance as compared to the undoped material.

In order for the alkali silicate materials to become moisture impermeable and relatively insoluble, the water must be nearly completely removed from the solution. The alkali silicate solutions may be cured at relatively low temperatures (e.g., less than or equal to 160 degrees Celsius, and between approximately 95 and 100 degrees Celsius according to a particular exemplary embodiment) to remove the water and solidify the material, thereby reducing residual stresses and processing costs. According to other exemplary embodiments, curing temperatures of greater than 160 degrees Celsius may be utilized. According to still other exemplary embodiments, curing temperatures of less than 100 degrees Celsius may be used as desired (e.g., air drying may remove a sufficient degree of moisture from the material for a particular application, particularly in environments where there is not substantial ambient humidity). For example, according to one exemplary embodiments, an alkali silicate solution may be cured at a temperature of between approximately 120 and 160 degrees Celsius for a period of between approximately 120 and 240 minutes to remove the water therefrom (although it should be understood that different curing times and temperatures may be used according to various other exemplary embodiments). It is intended that once cured, the material will advantageously be capable of withstanding high temperatures (e.g., up to a glass transition temperature of approximately 700 degrees Celsius).

The alkali silicate glass material may include one or more types of fillers (e.g., particles) added thereto so as to provide enhanced electrical and/or thermal conduction for the material (e.g., to allow for electrical interconnection between the electronic components through the material) or alternatively to provide enhanced electrical and/or thermal insulation. The alkali silicate glass material may also include materials therein for altering or modifying the thermal expansion characteristics of the material to allow it to better match the thermal expansion characteristics of the components to which it is coupled.

For example, high thermal conductivity particles, such as, but not limited to, diamond, aluminum nitride, beryllium oxide, or metals may be added to the solution prior to curing to improve the thermal conductivity of the resulting alkali silicate glass material. One possible application for such a material may be as a material for joining a heat spreader or similar component to another electronic component to remove heat from the electronic component.

Particles may also be added to modify the thermal expansion coefficient of the material. For example, a coefficient of thermal expansion (CTE) matching filler such as glass, ceramics, metals, or polymers may be added to the solution to modify the CTE of the final material, which may increase the utility of the material in applications such as underfills for flip-chip devices. This may improve its thermal cycle and shock loading reliability for high-temperature underfill applications (of greater than approximately 200 degrees Celsius). Current underfills, which are typically epoxy-based, are limited to relatively low operating temperatures (e.g., less than approximately 200 degrees Celsius) due to the fact that organics may decompose at higher temperatures.

The particles may be electrically and thermally conductive (e.g., metals, various forms of carbon, and some semiconducting ceramics) according to an exemplary embodiment. According to other exemplary embodiments, the particles may be electrically insulating but thermally conductive (e.g., diamond, aluminum nitride, beryllium oxide, etc.).

According to another exemplary embodiment, the alkali silicate glass material may include nanoparticle modifiers, including, but not limited to, nano calcium carbonate, nano zinc oxide and nano silicon dioxide. Aqueous alkali silicate composite solutions applied on or between surfaces of materials, dry to form a tough, tightly adhering inorganic bond that exhibits many desirable characteristics.

According to an exemplary embodiment, the alkali silicate glass material may be used as to couple or join two or more components together in an electronics package (e.g., in a wire-bonded or flip chip integrated circuit assembly). Various exemplary embodiments illustrating the use of the alkali silicate glass material in this manner are described below.

Figure 2:
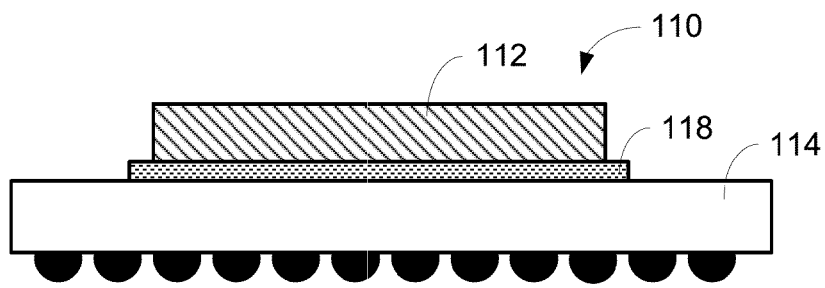
FIG. 2 is a schematic cross-sectional view of an integrated circuit assembly produced according to the method described with respect to FIG. 1 according to an exemplary embodiment.

FIG. 1 is a flow diagram illustrating steps in a method 100 for producing an integrated circuit assembly 110 according to an exemplary embodiment. FIG. 2 is a schematic cross-sectional view of an integrated circuit assembly 110 produced according to the method described with respect to FIG. 1.

As shown in FIG. 2, an integrated circuit 112 is coupled or joined to a substrate 114 (e.g., a silicon, alumina, aluminum nitride, silicon-germanium, or other type of suitable substrate) with an alkali silicate glass material 118. In this manner, the alkali silicate glass material 118 is intended to take the place of a conventional adhesive (e.g., an organic adhesive) that may be used to join the integrated circuit 112 to the substrate 114.

Figure 3:
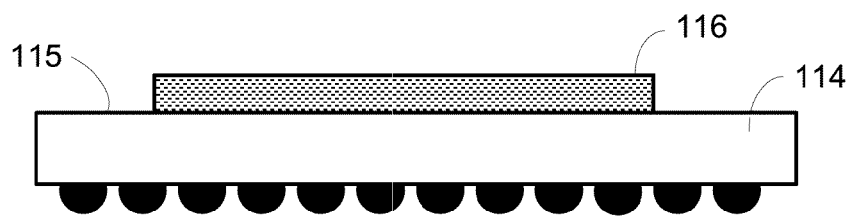
FIG. 3 is a schematic cross-sectional view of a substrate having an alkali silicate material solution provided thereon according to the method of FIG. 1.

In a step 102 of the method 100, the substrate 114 is prepared and provided for assembly, after which an alkali silicate glass material solution 116 is provided on a top surface thereof in a step 104 as illustrated in FIG. 3. According to an exemplary embodiment, the alkali silicate glass material solution 116 has a viscosity similar to that of liquid water. The thickness of the solution as provided may vary depending on the application and the material used. For example, if particle fillers are added to the alkali silicate solution, the minimum bond thickness may be limited by the size of the particles used. Where no particles are added, the bond thickness may be as low as desired (e.g., as low as approximately 200 nanometers). It should be understood that the viscosity and thickness of the solution may vary according to other exemplary embodiments.

According to an exemplary embodiment, the alkali silicate glass material solution 116 includes relatively small (e.g., between approximately 2 and 10 micrometer diameter) electrically conductive particles (e.g., particles of silver, tin, metal coated polymers, and/or other conductive materials) to allow it to be used as an anisotropically conductive adhesive (ACA) material that both mechanically bonds two surfaces together and provides electrical connection between locations on the surfaces. When the two horizontal surfaces are held against each other, the electrically conductive particles provide vertical electrical interconnect between aligned electrical pads, but because the radial distance between adjacent pads is much larger than the vertical distance between pads on the two surfaces, adjacent pads are not electrically connected. ACA's typically utilize an organic material as the adhesive, which limits their suitability in harsh environments. The use of the alkali silicate glass material 118, with appropriate electrical particles interspersed therein, is intended to provide an ACA that is less susceptible to moisture and corrosion. This material could then be used to provide the electrical interconnect and act as a mechanical underfill for flip chip attached components, for example, as described below with respect to FIGS. 5-8.

Figure 4:
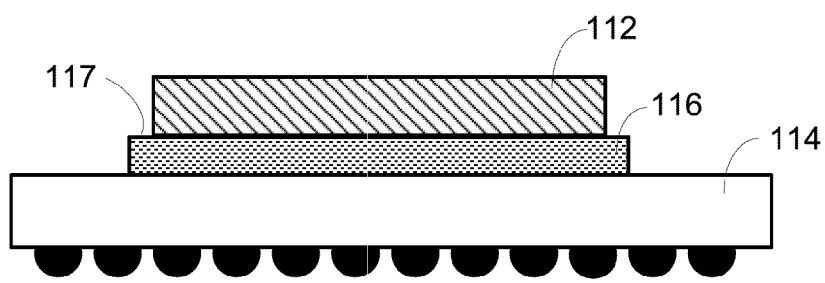
FIG. 4 is a schematic cross-sectional view of a substrate having an alkali silicate material solution and an integrated circuit die provided thereon according to the method of FIG. 1.

After the alkali silicate glass material solution 116 is provided, the integrated circuit die 112 is provided on a top surface 117 of the alkali silicate glass material solution 116 in a step 106 as shown in FIG. 4.

In a step 108 illustrated in FIG. 2, to permanently couple or join the integrated circuit die 112 to the substrate 114, the alkali silicate glass material solution 116 is cured at a relatively low temperature (e.g., less than or equal to approximately 160 degrees Celsius for a period of between approximately 120 and 240 minutes) to remove the moisture therefrom. The amount of shrinkage (if any) of the material will depend on the material used and other factors. For example, materials that include particles provided therein may be more resistant to shrinkage than those that do not.

Figure 5:
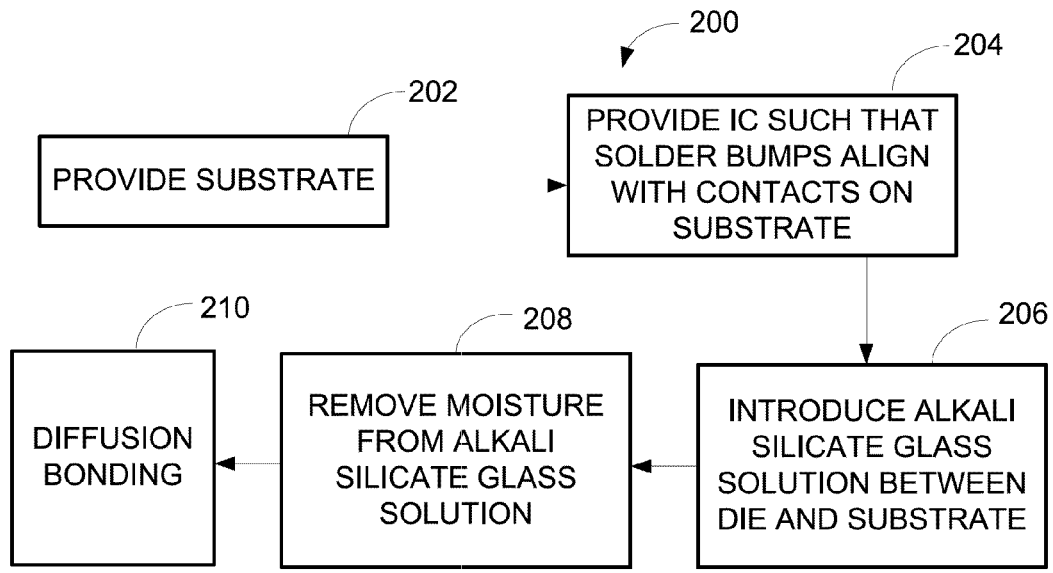
FIG. 5 is a flow diagram illustrating the steps in a method for producing a flip chip assembly according to an exemplary embodiment.
Figure 6:
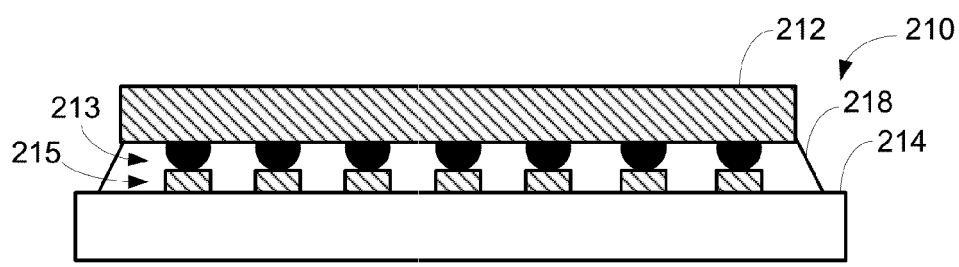
FIG. 6 is a schematic cross-sectional view of a flip chip assembly produced according to the method of FIG. 5 according to an exemplary embodiment.

FIG. 5 is a flow diagram illustrating steps in a method 200 for producing a flip chip integrated circuit assembly 210 according to another exemplary embodiment. FIG. 6 is a schematic cross-sectional view of a flip chip assembly 210 produced according to the method described with respect to FIG. 5.

Figure 7:
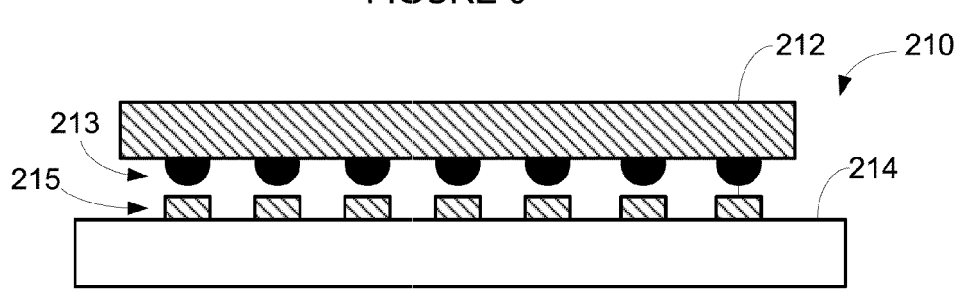
FIG. 7 is a schematic cross-sectional view of a flip chip assembly illustrating the positioning of the flip chip on a substrate in accordance with the method of FIG. 5.

As shown in FIG. 6, an integrated circuit 112 is provided in a step 202 that includes metal interconnect bumps 213 provided thereon for electrically coupling the integrated circuit 112 to an underlying substrate 214 in a flip chip configuration. As illustrated in FIG. 7, the metal bumps 213 are configured for alignment with contacts 215 provided on the substrate 214, as shown in FIG. 7. As the integrated circuit 212 is positioned on the substrate 214 in a step 204 shown in FIG. 8, the solder bumps make contact with the contacts 215 provided on the substrate 214. According to an exemplary embodiment, the metal bumps 213 and contacts 215 are formed from gold, copper, silver, tin, nickel or another metal or metal alloy.

Figure 8:
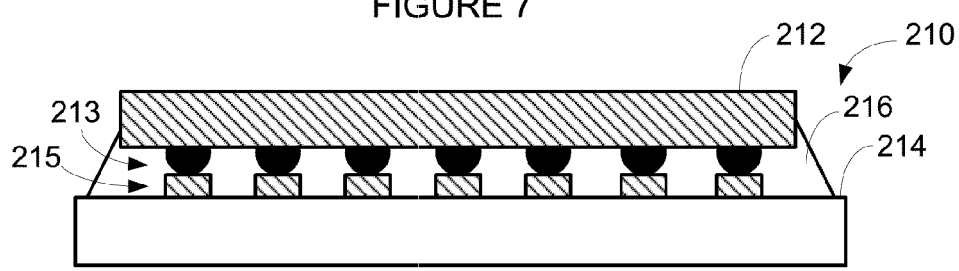
FIG. 8 is a schematic cross-sectional view of a flip chip assembly having an alkali silicate material solution introduced between a substrate and a flip chip in accordance with the method of FIG. 5.

In a step 206 shown in FIG. 8, an alkali silicate glass material solution 216 is provided as an underfill material for the flip chip assembly 210. The alkali silicate glass material solution 216 is then cured in a step 208 at a relatively low temperature (e.g., less than or equal to approximately 160 degrees Celsius) for an appropriate amount of time to remove the moisture therefrom (the curing time will depend on many factors, including, for example, the size of the device being bonded, the material used, the temperature used, and other factors).

In a step 210, diffusion bonding is performed to further couple the metal bumps 213 to the contacts 215 at a temperature of between approximately 200 and 300 degrees Celsius for a period of between approximately 3 and 5 minutes (although it should be understood that different times and temperature may be used according to other exemplary embodiments, and may vary depending on the material composition used). One advantageous feature of using the alkali silicate glass material 218 as an underfill material is that once cured, such material has a softening temperature of greater than approximately 700 degrees Celsius. Thus, during the subsequent diffusion bonding step 210, pressure is maintained between the metal bumps 213 and the contacts 215 at elevated temperatures, which is intended to speed metal diffusion required for the electrical and mechanical coupling of the components of the assembly 210.

To further enhance the diffusion bonding process, the alkali silicate glass solution 216 may include particles made from metals such as tin, silver, gold, indium, gallium, copper, nickel, bismuth, and other metals and alloys thereof. According to an exemplary embodiment, the alkali silicate glass solution 216 may include both a "parent" metal such as silver, gold, or copper as well as a low melting temperature metal such as tin, indium, gallium, bismuth, and other low melting temperature metals.

According to an exemplary embodiment, the particles (e.g., tin and silver particles) are provided at a loading volume of between approximately 10 and 70 percent. During the diffusion bonding process, the particles diffuse into the metal bumps 213 and contacts 215 to form a higher melting temperature alloy (e.g., where the metal bumps 213 and contacts 215 are formed from gold or a gold alloy, the addition of tin and/or silver produces an alloy in the interconnect bump that has a melting temperature that is higher than that of the original particles). One advantageous feature of using the alkali silicate glass to introduce tin into the diffusion bonding process is that the occurrence of metal oxidation may be reduced or eliminated (since the metal is not exposed to moisture or the ambient environment, particularly oxygen).

It should be noted that in addition to semiconductor substrates (e.g., silicon, silicon-germanium, gallium nitrogen, gallium arsenide, zinc oxide, sapphire, alumina, aluminum nitride, quartz, or other types of substrates), the method described with respect to FIGS. 5-8 may also be employed to adhere a bumped device flip chip device to a patterned indium tin oxide (ITO) coated glass material, such as that used in display technologies (it should be noted that other transparent conductive coatings may be used in display technologies, such as hydrogen impregnated alumina or other suitable materials). The relatively low curing temperatures and robustness of the cured material associated with alkali silicate glass may advantageously improve the reliability of these devices fabricated with chip on glass assembly processes.

It should also be noted that the examples described with respect to FIGS. 1-8 may also be applied to stacked die packaging assembly processes that utilize through silicon vias (TSVs) in which vias within an integrated circuit allow interconnections to be made between the active surface of the die and the back side of the die. Advantageous features of the alkali silicate glass material such as its relatively low coefficient of thermal expansion, moisture impermeability, and low temperature processing make this material particularly well-suited for multiple-die applications.

According to another exemplary embodiment, the alkali silicate glass material may include filler materials to enhance the thermal and/or electrical conductivity of the material. For example, an alkali silicate glass material may include filler materials such as diamond, aluminum nitride, beryllium oxide, silicon carbide, carbon nanotubes, graphite, pyrolytic graphite, metal fillers, or other suitable filler materials at a suitable volume loading (e.g., between approximately 50 and 90 percent). It should be understood that the material and volume loading may differ according to other exemplary embodiments depending on the particular application and desired performance characteristics. One advantageous feature of utilizing filler materials is that the resulting alkali silicate glass material may act both as a mechanical die attach material as well as a thermally and/or electrically conductive die attach material. Such filler materials may be used in conjunction with the alkali silicate glass material in conjunction with organic substrates, ceramic substrates, and stacked technologies such as silicon substrates or other devices.

Figure 9:
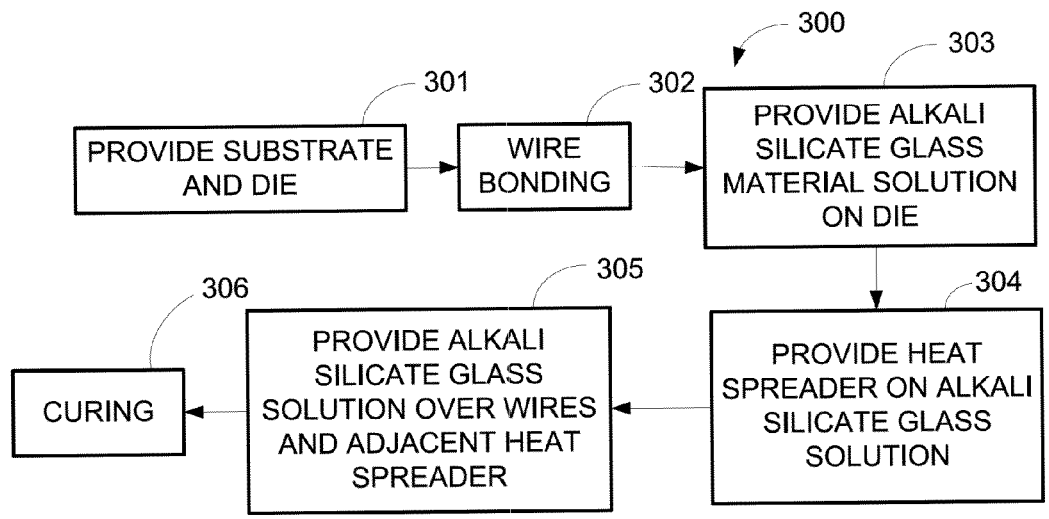
FIG. 9 is a flow diagram illustrating the steps in a method for producing an integrated circuit assembly according to another exemplary embodiment.
Figure 10:
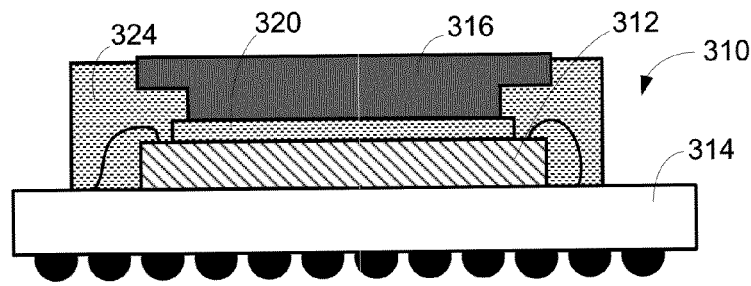
FIG. 10 is a schematic cross-sectional view of an integrated circuit assembly produced according to the method of FIG. 9 according to an exemplary embodiment.

FIG. 9 is a flow diagram illustrating steps in a method 300 for producing a wire bonded integrated circuit assembly 310 according to another exemplary embodiment. FIG. 10 is a schematic cross-sectional view of a wire bonded integrated circuit assembly 310 produced according to the method described with respect to FIG. 9. As shown in FIG. 10, the assembly 310 includes an integrated circuit die 312 provided on a substrate 314 in accordance with a step 301. A heat spreader 316 is provided above and coupled to the integrated circuit die 312.

Figure 11:
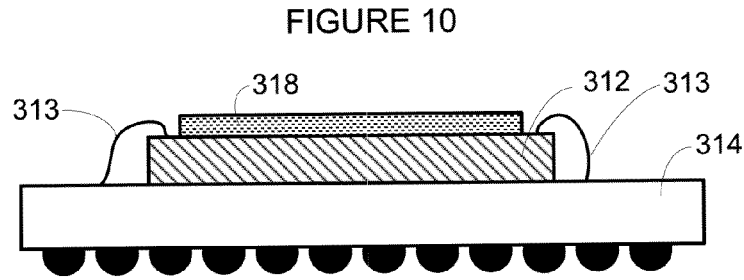
FIG. 11 is a schematic cross-sectional view of a substrate having an integrated circuit die and an alkali silicate material solution provided on the die according to the method of FIG. 9.

As shown in FIG. 11, in a step 302, a wire bonding operation is performed to electrically couple the integrated circuit die 312 to the substrate 314. Wires 313 may be made of any suitable electrically conductive material as is well known in the art.

In a step 303, an alkali silicate glass solution 318 is provided on the active side of the wire bonded integrated circuit 312. According to an exemplary embodiment, the alkali silicate glass solution 318 includes thermally conductive dielectric particles therein (e.g., diamond, etc.).

Figure 12:
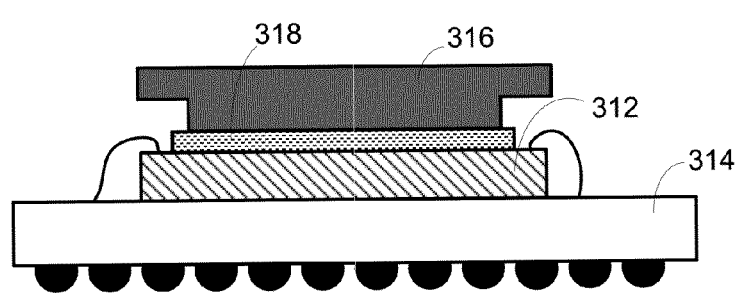
FIG. 12 is a schematic cross-sectional view of a substrate having an integrated circuit die and a heat spreader provided thereon according to the method of FIG. 9.
Figure 13:
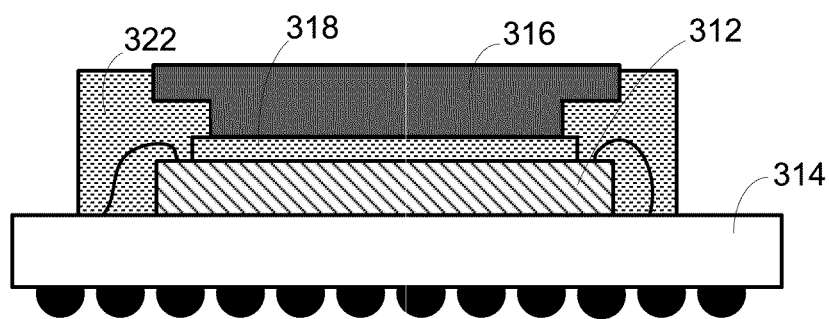
FIG. 13 is a schematic cross-sectional view illustrating the provision of an alkali silicate solution according to the method of FIG. 9.

A heat spreader 316 is provided in contact with the alkali silicate glass solution 318 in a step 304, as shown in FIG. 12, after which a second alkali silicate glass solution 322 is provided in a step 305 to encapsulate a portion of the assembly 310, as shown in FIG. 13. The alkali silicate glass solutions 318 and 322 are subsequently cured to remove the moisture therefrom, which results in solid alkali silicate glass regions 320 and 324. According to other exemplary embodiments, the alkali silicate glass solutions 318 and 322 may be cured in separate curing steps and/or the alkali silicate glass solutions 322 may be replaced with another type of encapsulation material such as epoxy-based materials.

As shown in FIG. 10, after the heat spreader 316 is attached to the integrated circuit die 312, the outer surface of the heat spreader 316 remains exposed for easy attachment to the next portion of the thermal path, such as the package lid, a finned heat sink, a heat pipe, or the like. The resulting device would be similar to a Quad Flatpack No Lead (QFN) or a flip chip device with an integrated heat spreader, except that the heat would not have to travel through the integrated circuit to go from the active surface to the heat spreader.

According to other exemplary embodiments, the alkali silicate glass materials may be used in a process to adhere two surfaces together to create a hermetic seal. For example, such material may be used to provide a low cost hermetic packaging method for devices that would otherwise use a glass frit, diffusion bonding, or welding. In addition to being lower cost, it would also be performed at much lower temperatures, making it suitable for devices such as MEMS and other products that require low temperature possessing.

Figure 14:
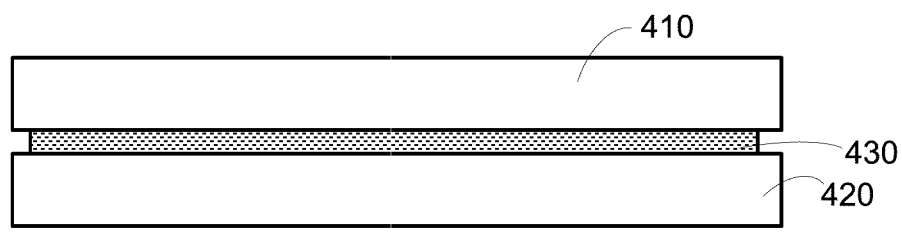
FIG. 14 is a schematic cross-sectional view illustrating two wafers or integrated circuit dies coupled together using an alkali silicate glass material according to an exemplary embodiment.

According to other exemplary embodiments, the alkali silicate glass material may be used to couple or attach integrated circuit wafers together as part of a Wafer Level Packaging (WLP) assembly process, as illustrated in FIG. 14, which illustrates two wafers 410 and 420 coupled together using an alkali silicate glass material 430. According to another exemplary embodiment, an alkali silicate glass material may be used to couple two integrated circuit dies together (as shown in FIG. 14, the wafers may be substituted with integrated circuit dies).

As will be appreciated by those reviewing the present disclosure, the use of alkali silicate glass materials to couple or join components of integrated circuit assemblies together provides various advantages over currently known technologies. For example, the relatively low moisture absorption and high chemical resistance of the cured alkali silicate glass provides enhanced long term reliability when used in harsh (humid, high temperature, corrosive, etc.) environments such as that experienced in avionics. Chemically inert particles can be added to the adhesive to modify its thermal expansion coefficient and thermal conductivity. Particles can also be added to modify the electrical properties of the material and/or to facilitate diffusion bonding when an alloying element is incorporated therein. Advantageously, the material may be cured at relatively low temperatures, which prevents damage to the surrounding components in the device.

According to various exemplary embodiments, the alkali silicate glass (ASG) composite can be used as a hermetic thermal coating and has dielectric material properties similar to or better than conventional coating materials. Once cured, the material may not absorb moisture, making it suitable for use in harsh environments in which humidity absorption can degrade mechanical properties of the coating and/or modify its performance. The material can be cured at low temperatures (e.g., 150° C. or less), thereby reducing residual stresses and processing costs. Filler materials can be added to the material to control the thermal expansion coefficient and give the material much higher thermal conductivity than can be achieved with conventional ceramic substrate materials. Coatings of ASG based materials can be robust, easily applied, and mixed with other materials to form a composite material. The composite can be tailored to create a barrier between the surfaces they are in contact with and their surroundings. The ASG based coating may also act as a medium for particles that modify an energy flux. ASG based materials can be used to create a barrier coating on a surface to prevent, or at least reduce, interactions with the environment around it (e.g., protection against moisture).

According to various exemplary embodiments, an alkali silicate glass composite can be used as a coating material in numerous applications including, but not limited to, electronics packaging. The low moisture absorption and high chemical resistance of the composite may greatly improve the long term reliability of the product when used in harsh environments (e.g., humid, high temperature, corrosive, etc.) such as those experienced by avionics. Chemically inert particles can be added to the coating to modify the thermal expansion coefficient and thermal conductivity. Particles can also be added to modify other properties (e.g., electrical properties) of the material as desired for any given application.

Figure 15:
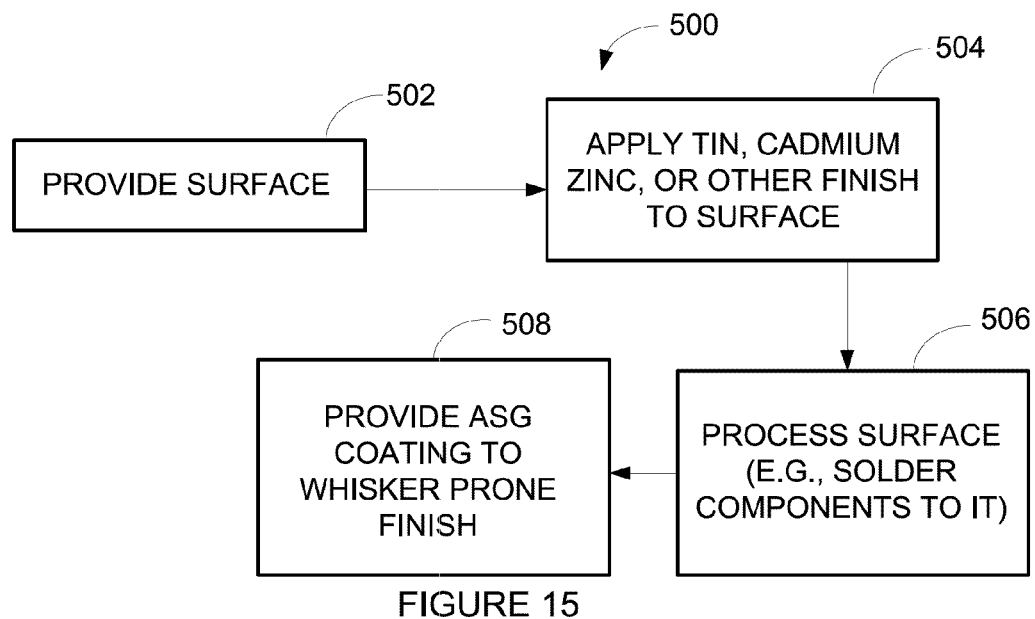
FIG. 15 is a flow diagram illustrating the steps in a method for making a protected surface according to another exemplary embodiment.
Figure 16:
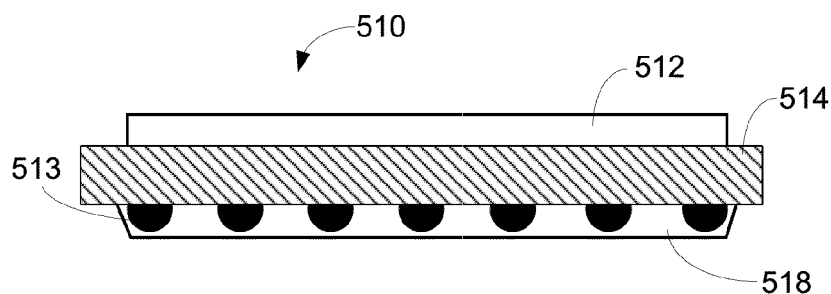
FIG. 16 is a schematic cross-sectional view of a circuit produced according to the method of FIG. 15 according to an exemplary embodiment.

Referring to FIG. 15, a process flow diagram illustrates a method 500 for making a protected surface according to an exemplary embodiment. Referring to FIG. 16, a schematic cross section illustrates an electronic assembly 510 produced by method 500 according to an exemplary embodiment. A surface 514 is provided at a step 502, for example a substrate, circuit board, a silicon wafer, another circuit, a communications port, an LED, a solar cell, a cooling pipe, or any other surface for protection. A tin, cadmium, zinc, or other finish is then applied to surface 514 at a step 504. Surface 514 is then processes at a step 506, for example, surface 514 may have at least one component 512 soldered to it. Component 512 may be any component or device capable of mounting on a surface, for example an integrated circuit, a resistor, a capacitor, a diode, a light emitting diode (LED), an inductor, a photovoltaic cell, etc. Soldering component 512 to surface 514 generally produces one or more soldering bumps or soldering joints 513. The solder may be any type of solder, for example a lead-free solder including tin, bismuth, copper, silver, indium, zinc, antimony, any combination thereof or a leaded solder. The surface finish (e.g., tin, cadmium, zinc, etc.) of the leads being soldered and the electrical interconnect to which they are soldered may be prone to whiskering and or corrosion.

An alkali silicate glass (ASG) based coating 518 is applied to solder joints, component leads, electrical interconnects, or other metallic surfaces 513 at a step 508 to at least partially cover one or more of the joints and whisker and/or corrosion prone surfaces. The ASG coating is generally configured to reduce the interaction between at least one of these metalized surfaces 513 and the environment around the surface. For example, the ASG coating may reduce the likelihood of or prevent the metal from oxidizing and/or corroding (e.g., chemical corrosion, galvanic corrosion, etc.) and increase moisture durability of the metal surface (e.g. solder joint, electrical interconnect, etc). The coating may also cover at least a portion of surface 514 and/or at least a portion of component 512 to prevent oxidation and/or increase moisture durability. The thickness of the ASG coating may be minimized to sufficiently protect the metal surfaces while being resistant to cracking and without taking up a large amount of space.

Figure 17:
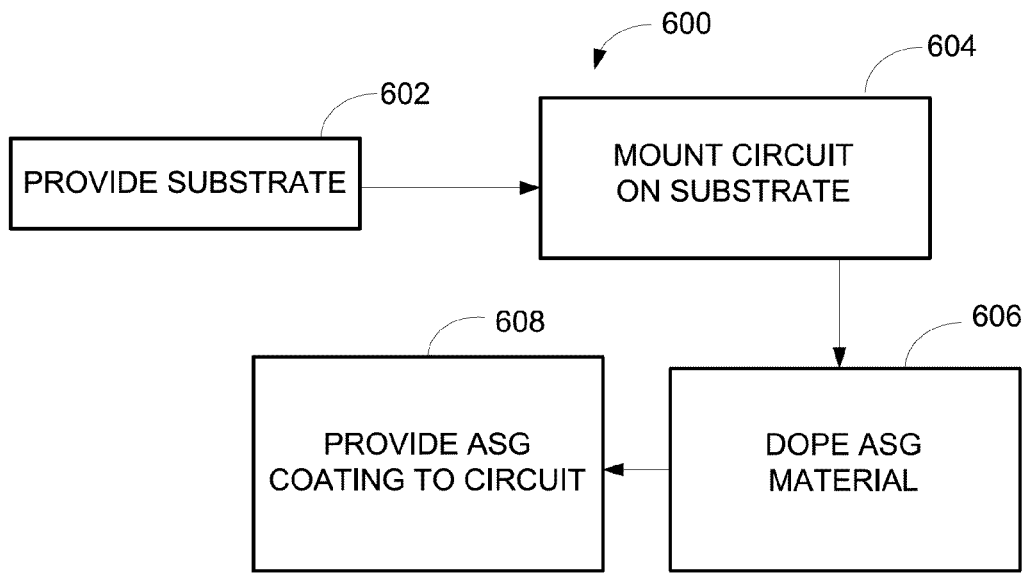
FIG. 17 is a flow diagram illustrating the steps in a method for making a circuit according to another exemplary embodiment.

Referring to FIG. 17, a process flow diagram illustrates a method 600 for making a circuit or other electronic device according to another exemplary embodiment. A substrate is provided at a step 602, for example a circuit board. An electronic device or circuit (e.g., an LED, a photovoltaic cell, and integrated circuit, etc.) is mounted on the substrate at a step 604. The mounting may include soldering the circuit to the substrate.

An ASG material is doped with a first element, dopant, or filler at a step 606. The first element is generally configured to affect the radiation that impacts the coating. For example, the dopant may affect the at least one of ultraviolet, x-ray, atomic and particle radiation, radio wave, infrared, and visible light radiation. According to various exemplary embodiments, the first element may include nano- or micro-particles, a chemical additive, ceramic particles, fluorescing particles, magnetic materials, a rare-earth material (e.g., a rare earth oxide powder, a ceramic oxide include rare earth materials, etc.), a lanthanide material, or an actinide material (e.g., depleted uranium). The ASG material may also be doped with additional elements including nano- or micro-particles, a chemical additive, fluorescing particles, magnetic materials, or a rare-earth material. According to some exemplary embodiments where a fluorescing particle is used, the fluorescing particle may be a nanophosphor. According to other exemplary embodiments, the ASG material may be doped with diamond, aluminum nitride, boron nitride, silica, and/or alumina material. According to some exemplary embodiments, the ASG material may be doped with at least 2 molar percent of the first element.

According to other exemplary embodiments, the ASG material may be doped with between about 3 and 25 molar percent of the first element. According to still other exemplary embodiments, the ASG material may be doped with greater than about 25 molar percent of the first element. According to further exemplary embodiments, the ASG material may be doped with less than about 2 molar percent of the first element if nano- or micro-particles are used.

The doped ASG material is then used to coat a surface of the circuit at a step 608. According to various exemplary embodiments, the coating is configured to protect the circuit from environmental corrosion or oxidation due to water or moisture. According to some exemplary embodiments, the coating is also configured to block or absorb electromagnetic radiation. According to other exemplary embodiments, the coating is configured to allow electromagnetic radiation to pass through the coating. According to other exemplary embodiments, the coating may be configured to retransmit electromagnetic radiation of a first wavelength as electromagnetic radiation of a second and different wavelength. According to other exemplary embodiments, the coating may not be doped with a dopant or particle additive.

Figure 18:
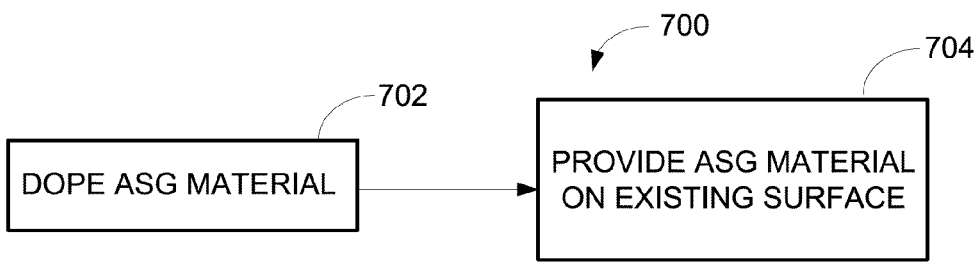
FIG. 18 is a flow diagram illustrating the steps in a method for coating a surface according to an exemplary embodiment.
Figure 19:
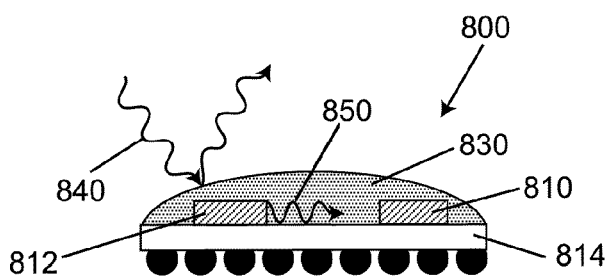
FIG. 19 is a schematic cross-sectional view of a circuit produced according to the method of FIG. 17 according to an exemplary embodiment.
Figure 20:
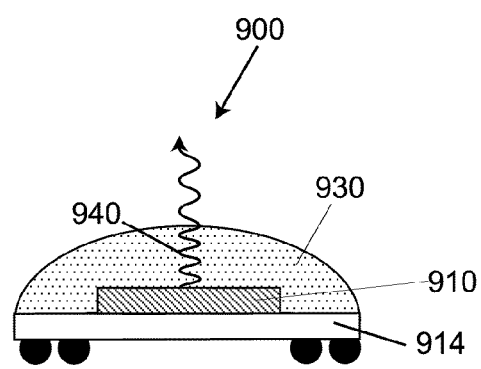
FIG. 20 is a schematic cross-sectional view of a circuit produced according to the method of FIG. 17 according to another exemplary embodiment.
Figure 21:
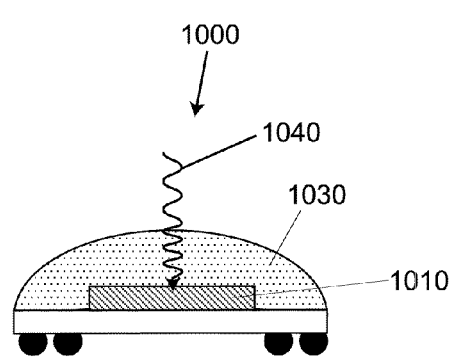
FIG. 21 is a schematic cross-sectional view of a circuit produced according to the method of FIG. 18 according to another exemplary embodiment.

Referring to FIG. 18, a flow diagram illustrates the steps in a method 700 for coating an existing surface according to an exemplary embodiment. According to the various exemplary embodiments of step 606, an ASG material is doped with an element to affect the electromagnetic radiation passing through the ASG material. The doped material can then be applied as a coating on an existing surface. For example, the ASG material can be applied to a solar cell, a window, a sealing surface between two materials, etc. in order to protect the surface from moisture or water. The ASG material can also protect the surface or object behind the surface from electromagnetic radiation. For example, a coated window may reduce the amount of ultraviolet (UV), visible, or infrared rays that pass through as well as dissipate any heat transferred by the rays. FIGS. 19-21 provide further examples of ASG coated circuits or surfaces. It is noted that according to other exemplary embodiments, the ASG coating may be formulated to provide protection without the need for doping.

Referring to FIG. 19, an electronics package 800 includes a circuit 810 and a circuit 812 mounted on a substrate 814 and at least partially encapsulated by an ASG material 830 according to an exemplary embodiment. The ASG material is doped with conductive particles for blocking or absorbing RF energy or radiation, at least partially shielding circuits 810 and 812 from radio waves. A mixed electronics device having analog circuitry (e.g., circuit 812) and digital circuitry (e.g., circuit 810) can be coated with an ASG material doped with the conductive particles in a manner configured to reduce or prevent crosstalk between the circuitry and/or electromagnetic interference from outside package 800. When used for such applications, the dopant may be metallic particles or magnetic particles at a quantity greater than 5 volume percent up to 95.1 volume percent (for quaternary (4-particle size) particle packing). The encapsulant (ASG material 830) can both physically protect the integrated circuits from moisture with a hermetic or near hermetic seal as well as reduce electromagnetic interference between components or from outside sources. For example, electronics package 800 may reflect or block an incoming RF signal 840 or absorb an RF signal transmitted by circuit 812 in the direction of circuit 810.

According to some exemplary embodiments, ASG coating 830 may also include materials to absorb atomic particles to provide radiation hardening, for example to block x-ray, atomic radiation (gamma-ray, alpha, beta, etc.), and/or UV radiation and to reduce the likelihood that circuit 810 or 812 will fail due to defect formation caused by the radiation. It is noted that according to other exemplary embodiments, the ASG coating may be formulated to provide protection without the need for doping.

Referring to FIG. 20, an electronics package 900 includes a light emitting diode (LED) 910 mounted on a substrate 914 and at least partially encapsulated by an ASG material 930 according to an exemplary embodiment. ASG material 930 may be doped with particles for spreading or diffusing visible light radiation. ASG material 930 may be doped with fluorescing particles that at least partially absorb light from LED 910 and emit or retransmit the light at a different wavelength. Certain wavelengths of light (e.g., certain colors) are difficult to generate in light emitting diodes. Multiple colors are generally needed to produce white light and the efficiency of generating each color may not be the same. According to the illustrated exemplary embodiment, ASG 930 with the integrated fluorescing particles may be excited by an LED (e.g., a highly efficient LED) to retransmit the light at a different wavelength while providing a robust coating that is generally optically clear and that can be processed at low temperatures. It is noted that according to other exemplary embodiments, the ASG coating may be formulated to provide protection without the need for doping. Similarly, specific bandwidths of light may be difficult to generate or filter, but ASG 930 with tailored particles may be used to do this.

Referring to FIG. 21, a solar panel 1000 includes at least one photovoltaic cell 1010 mounted on a substrate 1014 and at least partially coated by an ASG material 1030 according to an exemplary embodiment. ASG material 1030 is doped with particles for absorbing specific wavelengths of electromagnetic radiation 1040 and for retransmitting the radiation at a different wavelength. ASG material 1030 may coat entire solar panels to reduce or the amount of moisture (potentially resulting in corrosion and performance degradation) on solar panel 1000 while allowing solar radiation to pass through. ASG material 1030 can be used to provide increased protection from at least one of environmental corrosion due to water or moisture, UV light (e.g., from the sun), and radiation protection (e.g., for use in space or military applications). ASG material 1030 is doped with appropriate fillers, for example nanoparticles or chemical additives.

According to other exemplary embodiments, fluorescing particles can be added to absorb harmful UV light and emit or retransmit useable light (e.g., visible light) to photovoltaic cell 1010 for conversion to electrical energy. ASG coating 1030 generally has an appropriate refractive index (e.g., by formulation or nano-particle additives) that can be used to create anti-reflective coatings that allow the solar cell to capture more light. ASG coatings may not significantly degrade over time or darken from UV or other radiation exposure, can provide hermetic or near hermetic protection of the surface of photovoltaic cell 1010, and can withstand high temperatures (e.g., up to about 500-600 degrees Celsius), contrary to polymer based coatings. It is noted that according to other exemplary embodiments, the ASG coating may be formulated to provide protection without the need for doping.

According to some exemplary embodiments, the coating may be chemically treated to have a specific refractive index or refractive index gradient between the substrate and air. According to other exemplary embodiments, multiple layers of glass coating having increasing or decreasing refractive index could be used.

Figure 22:
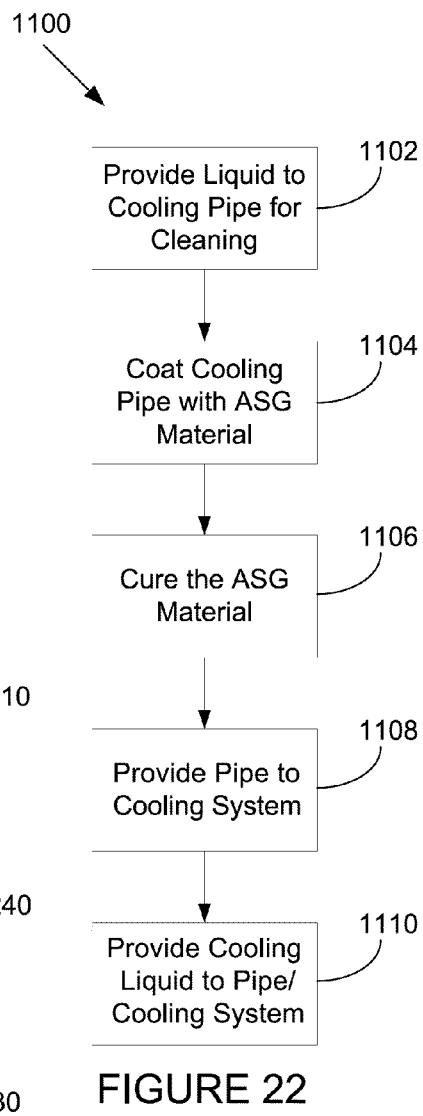
FIG. 22 is a flow diagram illustrating the steps in a method for coating a cooling pipe according to an exemplary embodiment.

Referring to FIG. 22, a flow diagram illustrates the steps in a method 1100 for coating a cooling pipe used to cool a device (e.g., an MRI, NMR, or other electronic device) according to an exemplary embodiment. According to various exemplary embodiments, the cooling pipe may be made of copper or another metal. The coolant traveling in the cooling pipe may be water, another liquid, or any fluid capable of transferring heat. A liquid for cleaning is provided in the cooling pipe in order to clean the interior surface of the cooling pipe at a step 1102. The cleaning solution may be a standard metal cleaner (e.g. acid, detergent, etc). After application, any residual or remaining liquid can be removed via evaporation, via heat or blown air, or otherwise.

At least a portion of the interior of the cooling pipe is then coated with an ASG material that is configured to provide a dielectric barrier at a step 1104. According to one exemplary embodiment, a galvanic junction in the cooling pipe may be coated. According to other exemplary embodiments, the interior of the entire heat exchange area of the cooling pipe may be coated. In this embodiment, the ASG material is generally a highly durable material with a high silicate content or "R value." R values (e.g., $SiO_2$ to $M_2O$ weight ratio when metal oxides are added) of the ASG material at about 4.0 or higher are expected to be particularly suitable for this application, however according to other exemplary embodiments, the ASG material may have an R value of greater than about 3.5 or greater than about 3.0. For example, a molar ratio of 1:1 of a binary alkali or silicate may be added along with a nano or microparticle dopant to achieve the desired durability. It is noted that according to other exemplary embodiments, the ASG coating may be formulated to provide protection without the need for doping.

The ASG coating on the interior of the pipe is then cured at a step 1106 so it bonds with or adheres to the cooling pipe. The coating may be cured by blowing air through the cooling pipe (e.g., drying the coating) or by heating the coating and cooling pipe. The cured coating is generally an insulator and configured to maintain the purity of the fluid (e.g., water, refrigerant, etc.) flowing in the cooling pipe by reducing corrosion of the cooling pipes, which lead to contamination and increased conductivity of the cooling liquid. Therefore, the likelihood or degree to which the fluid flowing in the cooling pipe is conductive or contaminated may be decreased. Additionally, according to various exemplary embodiments the ASG coating may prevent or reduce oxidation of the cooling pipe during handling or exposure.

The cooling pipe with the cured ASG material is provided to or installed in a cooling system at a step 1108. The cooling liquid is provided into the cooling pipe or cooling system at a step 1110. According to various exemplary embodiments, the cooling liquid can be water, a refrigerant, another liquid, or any other fluid capable of transferring heat.

It is noted that according to other exemplary embodiments, various steps of method 1100 may be omitted or rearranged. According to some exemplary embodiments, steps 1108 and 1110 may be omitted. According to other exemplary embodiments, step 1101 may be omitted. According to still other exemplary embodiments, steps 1102, 1108, and 1110 may be omitted.

Figure 23:
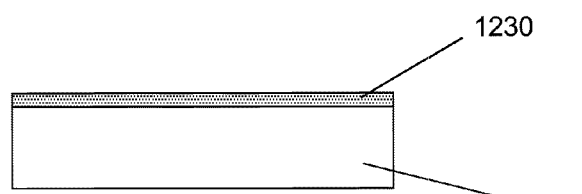
FIG. 23 is a schematic cross-sectional view of a coated surface produced according to the method of FIG. 18 or FIG. 21 according to an exemplary embodiment.

Referring to FIG. 23, a cross section of a thin ASG based coating 1230 on a metal surface 1210 (e.g., metal pipe, metal heat exchanger, etc.) for preventing or reducing the amount of oxygen contacting the metal to form a metal-oxide layer is illustrated according to an exemplary embodiment.

Figure 24:
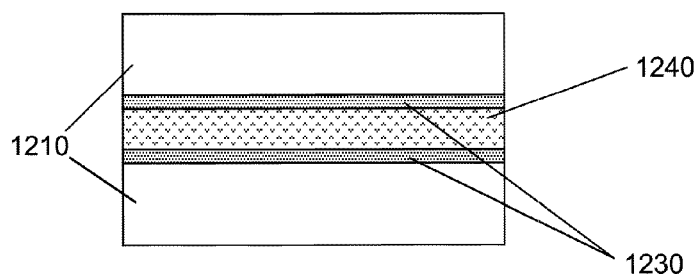
FIG. 24 is a schematic cross-sectional view of a coated surface produced according to the method of FIG. 18 or FIG. 21 according to another exemplary embodiment.

Referring to FIG. 24, a cross section of a thin ASG based coating 1230 around an interior of a cooling pipe 1210 (e.g., made of copper or another metal) is illustrated according to an exemplary embodiment. A cooling fluid 1240 flows in cooling pipe 1210 and across ASG based coating 1230 without contacting cooling pipe 1210, preventing or reducing the likelihood of a reaction between cooling pipe 1210 and fluid 120. According to one exemplary embodiment, the cooling fluid 1240 may be a highly corrosive liquid, such as liquid metal and the ASG based coating 1230 may prevent or reduce the likelihood that a chemical or metallurgical interaction between solid and liquid metals occurs. According to other exemplary embodiments, the fluid 1240 may be water, a refrigerant, or another type of coolant. According to various exemplary embodiments, the thickness of ASG layers 1230 may be optimized to reduce the likelihood of pinholes or lack of coverage (as with thick coatings) while exhibiting little cracking (as with thin coatings). According to one exemplary embodiment, the thickness of ASG coating 1230 may be about 1 micron. According to another exemplary embodiment, the thickness of ASG coating 1230 may be less than or greater than 1 micron.

Various features of alkali silicate glass materials in the context of coatings for integrated circuit and electronics packages are described in co-pending U.S. patent application Ser. No. 11/508,782, filed Aug. 23, 2006 and co-pending U.S. patent application Ser. No. 11/959,225, filed Dec. 18, 2007, the entire disclosures of which are incorporated herein by reference.

According to various exemplary embodiments, the coating may be a coating described in U.S. patent application Ser. No.

11/508,782, filed on Aug. 23, 2006, and entitled "Integrated Circuit Protection and Ruggedization Coatings and Methods," U.S. patent application Ser. No. 11/784,158, filed on Apr. 5, 2007 and entitled "Hermetic Seal and Hermetic Connector Reinforcement and Repair with Low temperature Glass Coatings," U.S. patent application Ser. No. 11/732,982, filed on Apr. 5, 2007, and entitled "A Method for Providing Near-Hermetically Coated Integrated Circuit Assemblies," U.S. patent application Ser. No. 11/732,981, filed on Apr. 5, 2007, and entitled "A Method for Providing Near-Hermetically Coated, Thermally Protected Integrated Circuit Assemblies," U.S. patent application Ser. No. 11/784,932, filed on Apr. 10, 2007, and entitled "Integrated Circuit Tampering Protection and Reverse Engineering Prevention Coatings and Methods," U.S. patent application Ser. No. 11/959,225, filed on Dec. 18, 2007, and entitled "Adhesive Applications Using Alkali Silicate Glass for Electronics," U.S. patent application Ser. No. 11/959,225, filed Dec. 18, 2007, and entitled "Adhesive Applications for Using Alkali Silicate Glass for Electronics," and U.S. application Ser. No. 12/116,126, filed on May 6, 2008, and entitled "System and Method for a Substrate with Internal Pumped Liquid metal for thermal Spreading and Cooling," each of which is herein incorporated by reference in its entirety.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that references to relative positions (e.g., "top" and "bottom") in this description are merely used to identify various elements as are oriented in the FIGURES. It should be recognized that the orientation of particular components may vary greatly depending on the application in which they are used.

For the purpose of this disclosure, the term "coupled" means the joining of two members directly or indirectly to one another. Such joining may be stationary in nature or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It is also important to note that the construction and arrangement of the components as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may be made in the design, operating conditions and arrangement of the various exemplary embodiments without departing from the scope of the present inventions as expressed in the appended claims.

What is claimed is:

1. A coating for reducing interaction between a surface and the environment around the surface, wherein the surface is a surface of a solar cell, the coating comprising:
    an alkali silicate glass material configured to protect the surface of the solar cell from environmental corrosion due to water or moisture, wherein the alkali silicate glass material is doped with a first element to affect radiation passing through the coating, wherein the first element comprises fluorescing particles configured to block the radiation and retransmit usable light to the solar cell, wherein the radiation which is blocked is at least one of ultraviolet, x-ray, gamma ray, and radio wave radiation, the coating is at least partially transparent.

2. The coating of claim 1, wherein the fluorescing particles are nanophosphors.

3. A coating for reducing corrosion of a solar cell, comprising:
    an alkali silicate glass material configured to protect the solar cell from environmental corrosion due to water or moisture,
    wherein the alkali silicate glass material forms an inorganic bond with a portion of the solar cell; and
    wherein the alkali silicate glass material does not contain an organic material.

4. The coating of claim 3, wherein the alkali silicate glass material is configured to provide protection to the solar cell from ultraviolet radiation.

5. The coating of claim 4, wherein the alkali silicate glass material is doped with fluorescing rare earth oxide nanoparticles that absorb UV radiation and emit or fluoresce a visible wavelength that the solar cell can convert into electrical energy.

6. The coating of claim 3, wherein the alkali silicate glass material is an anti-reflective material configured to improve light transmission into the solar cell.

7. The coating of claim 6, wherein a refractive index of the alkali silicate glass material is modified by a dopant or by modifying the alkali silicate glass chemistry.

8. The coating of claim 6, further comprising multiple layers of alkali silicate glass material, each layer of alkali silicate glass material having a different refractive index.

9. A coating for reducing corrosion of a solar cell, comprising:
    an alkali silicate glass material configured to protect the solar cell from environmental corrosion due to water or moisture,
    wherein the alkali silicate glass material forms an inorganic bond with a portion of the solar cell;
    wherein the alkali silicate glass material is configured to provide protection to the solar cell from ultraviolet radiation; and
    wherein the alkali silicate glass material is doped with fluorescing rare earth oxide nanoparticles that absorb UV radiation and emit or fluoresce a visible wavelength that the solar cell can convert into electrical energy.

10. A coating for reducing corrosion of a solar cell, comprising:

an alkali silicate glass material configured to protect the solar cell from environmental corrosion due to water or moisture,
wherein the alkali silicate glass material forms an inorganic bond with a portion of the solar cell;
wherein the alkali silicate glass material is an anti-reflective material configured to improve light transmission into the solar cell; and
a refractive index of the alkali silicate glass material is modified by a dopant or by modifying the alkali silicate glass chemistry.

* * * * *

UNITED STATES PATENT AND TRADEMARK OFFICE
CERTIFICATE OF CORRECTION

| | | |
|---|---|---|
| PATENT NO. | : 8,617,913 B2 | Page 1 of 1 |
| APPLICATION NO. | : 12/240775 | |
| DATED | : December 31, 2013 | |
| INVENTOR(S) | : Nathan P. Lower et al. | |

It is certified that error appears in the above-identified patent and that said Letters Patent is hereby corrected as shown below:

In the Claims

Column 16:
    Line 23, please insert --and wherein-- before "the coating"

Signed and Sealed this
Fifteenth Day of April, 2014

Michelle K. Lee
*Deputy Director of the United States Patent and Trademark Office*